(12) United States Patent
Han (10) Patent No.: US 10,242,623 B2
(45) Date of Patent: Mar. 26, 2019

(54) ORGANIC LIGHT EMITTING DISPLAY APPARATUS AND DRIVING METHOD THEREOF

(71) Applicant: LG DISPLAY CO., LTD., Seoul (KR)

(72) Inventor: Kyuil Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 97 days.

(21) Appl. No.: 15/192,571

(22) Filed: Jun. 24, 2016

(65) Prior Publication Data

US 2017/0004772 A1 Jan. 5, 2017

(30) Foreign Application Priority Data

Jun. 30, 2015 (KR) ........................ 10-2015-0093839

(51) Int. Cl.
*G06F 3/041* (2006.01)
*G09G 3/36* (2006.01)
(Continued)

(52) U.S. Cl.
CPC ............ *G09G 3/3258* (2013.01); *G09G 3/325* (2013.01); *G09G 3/3233* (2013.01); *H01L 27/326* (2013.01); *G09G 2300/043* (2013.01); *G09G 2300/0842* (2013.01); *G09G 2300/0861* (2013.01); *G09G 2320/0214* (2013.01); *G09G 2320/0233* (2013.01); *G09G 2320/0242* (2013.01); *G09G 2320/041* (2013.01)

(58) Field of Classification Search
CPC .... G09G 3/3233; G09G 3/325; G09G 3/3258; G09G 2300/043; G09G 2300/0842; G09G 2300/0861; G09G 2320/0214; G09G 2320/0233; G09G 2320/0242; G09G 2320/041; G09G 3/00; H01L 27/326; G02F 1/13338; G06F 3/0412; G06F 3/0416; G06F 3/044; G06F 2203/04102; G06F 2203/04103; G06F 2203/04107; G06F 2203/04111; G06F 2203/04112
See application file for complete search history.

(56) References Cited

U.S. PATENT DOCUMENTS

2003/0062524 A1 4/2003 Kimura
2006/0092146 A1 5/2006 Johnson et al.
(Continued)

FOREIGN PATENT DOCUMENTS

CN 1407629 A 4/2003
CN 101206826 A 6/2008
(Continued)

*Primary Examiner* — Nelson M Rosario
(74) *Attorney, Agent, or Firm* — Birch, Stewart, Kolasch & Birch, LLP (57) ABSTRACT

An organic light emitting display apparatus according to an embodiment includes a thermal sensor configured to sense temperature and a controller including a first leakage current compensation unit configured to supply a first compensation signal to a plurality of sub-pixels based on the sensed temperature from the thermal sensor and a second leakage current compensation unit configured to supply a second compensation signal, which is different from the first compensation signal, wherein the controller compensates an amount of leakage current of the plurality of sub-pixels according to the sensed temperature.

14 Claims, 9 Drawing Sheets

(51) Int. Cl.
*G09G 3/3258* (2016.01)
*G09G 3/3233* (2016.01)
*G09G 3/325* (2016.01)
*H01L 27/32* (2006.01)

(56) References Cited

U.S. PATENT DOCUMENTS

| | | | |
|---|---|---|---|
| 2008/0143656 A1* | 6/2008 | Hasegawa | G09G 3/3233 345/84 |
| 2009/0033685 A1 | 2/2009 | Park et al. | |
| 2009/0201231 A1* | 8/2009 | Takahara | G09G 3/3233 345/76 |
| 2010/0103159 A1 | 4/2010 | Leon | |
| 2016/0104407 A1* | 4/2016 | Hong | G09G 3/3648 345/55 |

FOREIGN PATENT DOCUMENTS

| | | |
|---|---|---|
| CN | 101210846 A | 7/2008 |
| CN | 101996595 A | 3/2011 |

\* cited by examiner

ORGANIC LIGHT EMITTING DISPLAY APPARATUS AND DRIVING METHOD THEREOF

CROSS REFERENCE TO RELATED APPLICATIONS

This application claims the priority benefit of the Korean Patent Application No. 10-2015-0093839 filed on Jun. 30, 2015, which is hereby incorporated by reference as if fully set forth herein.

BACKGROUND OF THE INVENTION

Technical Field

The present disclosure relates to an organic light emitting display apparatus and driving method thereof, and more particularly, to an organic light emitting display apparatus and driving method thereof which are capable of compensating a deteriorated image quality caused by leakage current between sub-pixels in which the amount of leakage current varies according to its temperature.

Discussion of the Related Art

As the information age has heightened, display apparatuses for visualizing digital image signals have been rapidly developed. In this regard, research has been continuously conducted on various display apparatuses to develop thin, light weight and low power consumption display apparatuses. Typical examples of such display apparatuses include a plasma display panel (PDP), a field emission display (FED), an electro-wetting display (EWD), a liquid crystal display (LCD) and an organic light emitting display device (OLED).

An organic light emitting display apparatus, which is a self-luminous display device, does not require a separate light source such as a liquid crystal display apparatus, and is therefore made in a light weight and thin form. In addition, the organic light emitting display apparatus is advantageous in terms of low power consumption, wide color gamut, fast response speed, wide viewing angle and infinite contrast ratio. For these reasons, the organic light emitting display apparatus has been regarded as the next generation display.

A pixel area of an organic light emitting display apparatus comprises a plurality of sub-pixels. Each of the sub-pixels comprises an organic light emitting diode (OLED). Each of the organic light emitting diode comprises an anode, an organic emission layer and a cathode.

For the sake of convenience in terms of manufacturing an organic light emitting diode of each sub-pixel, a common layer may be formed over the substantial whole surface by using the open mask technique. For example, at least one common layer is formed to cover the overall pixel area by a whole surface deposition method, which is positioned between an anode and a cathode. Thus, the common layer may act as a leakage current path to the adjacent sub-pixels.

The common layer may be referred as any layer among various layers positioned between an anode and a cathode for improving the performance of the organic light emitting diode. The common layer may be referred as various layers which are configured to cover the overall area of the pixel area and not patterned at each of the sub-pixels. Such common layer may be, for example, an organic layer, a doping layer and/or a conductive layer. Moreover, such common layer may be a hole injection layer (HIL), a hole transport layer (HTL), an electron blocking layer (EBL) and/or an emission layer (EML).

Such common layer may be formed in various ways, and it is not limited to its material, thickness and/or shape. Moreover, such common layer may be referred as any layer positioned between an anode and a cathode and capable of providing a leakage current path to adjacent sub-pixels. In particular, the common layer, capable of allowing the leakage current to flow, may have a conductive characteristic. In addition, the conductivity or resistivity of the common layer may vary according to its temperature. Therefore, the amount of leakage current may vary according to temperature.

The adjacent sub-pixels may be affected by the unwanted leakage current passed through the common layer. Thus, the adjacent sub-pixels may be undesirably emitted by the emitting sub-pixel due to the leakage current. Thus, the contrast ratio may be reduced by the undesired emission. Moreover, the color gamut may be reduced by the leakage current such that the undesired emission provides undesired color contents at the adjacent sub-pixels. Furthermore, the white balance may be shifted. Accordingly, the image quality may be deteriorated.

SUMMARY OF THE INVENTION

One of the problems of the leakage current is that it occurs at the common layer of the pixel area of the organic light emitting display apparatus, which is difficult to suppress due to its physical characteristics. In addition, there are difficulties for manufacturing an organic light emitting display apparatus without the common layer. Therefore, it is difficult to fundamentally eliminate the entire leakage current phenomenon. In addition, the common layer which is a path for the leakage current has a variable electrical resistance characteristic according to its temperature.

The inventor of the present disclosure has recognized that the amount of leakage current depends on the temperature according to self-heating or ambient temperature of the organic light emitting display apparatus.

The inventor of the present disclosure has conducted research and development regarding the leakage current characteristics according to the change in temperature of the organic light emitting diode of each sub-pixel of the organic light emitting display apparatus in order to improve the deteriorated image quality according to the change in temperature.

Accordingly, one of the objects of the present disclosure is to provide a novel organic light emitting display apparatus comprising a controller capable of analyzing the change of the amount of the leakage current according to temperature and compensating the deteriorated image quality according to the change in temperature. Another object of the present disclosure is to provide a novel organic light emitting display apparatus which addresses or minimizes the limitations and problems associated with the organic light emitting display apparatuses of the related art.

It should be noted that objects of the present disclosure are not limited to the above-described objects, and other objects of the present disclosure will be apparent to those skilled in the art from the following descriptions.

According to an aspect of the present disclosure, there is provided an organic light emitting display apparatus comprising: a thermal sensor configured to sense a temperature, a controller including a first leakage current compensation unit configured to supply a first compensation signal to a plurality of sub-pixels based on the sensed temperature from the thermal sensor and a second leakage current compensation unit configured to supply a second compensation signal which is different from the first compensation signal, wherein the controller is configured to compensate an amount of leakage current of the plurality of sub-pixels according to the sensed temperature.

According to the present disclosure, there is an advantage of compensating the deteriorated image quality caused by the leakage current according to temperature by providing a leakage current compensation unit.

Moreover, according to the present disclosure, regardless of the layout or the structure of the common layer, there is an advantage of compensating the deteriorated image quality caused by the leakage current according to the change in temperature by applying a leakage current compensation unit.

It should be noted that the effects of the present disclosure are not limited to those described above and other effects of the present disclosure will be apparent to those skill in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Advantages and features of the present disclosure and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present invention will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present disclosure. Further, in the following description, a detailed explanation of known related technologies may be omitted to avoid unnecessarily obscuring the subject matter of the present disclosure. The terms such as "including", "having", and "comprising" used herein are generally intended to allow other components to be added unless the terms are used with the term "only". Any references to singular may include plural unless expressly stated otherwise.

Components are interpreted to include an ordinary error range or an ordinary tolerance range even if not expressly stated.

When the position relation between two parts is described using the terms such as "on", "above", "below", and "next", on or more parts may positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole description, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Various exemplary embodiments of the present disclosure will be described in detail with reference to the accompanying drawings.

Figure 1:
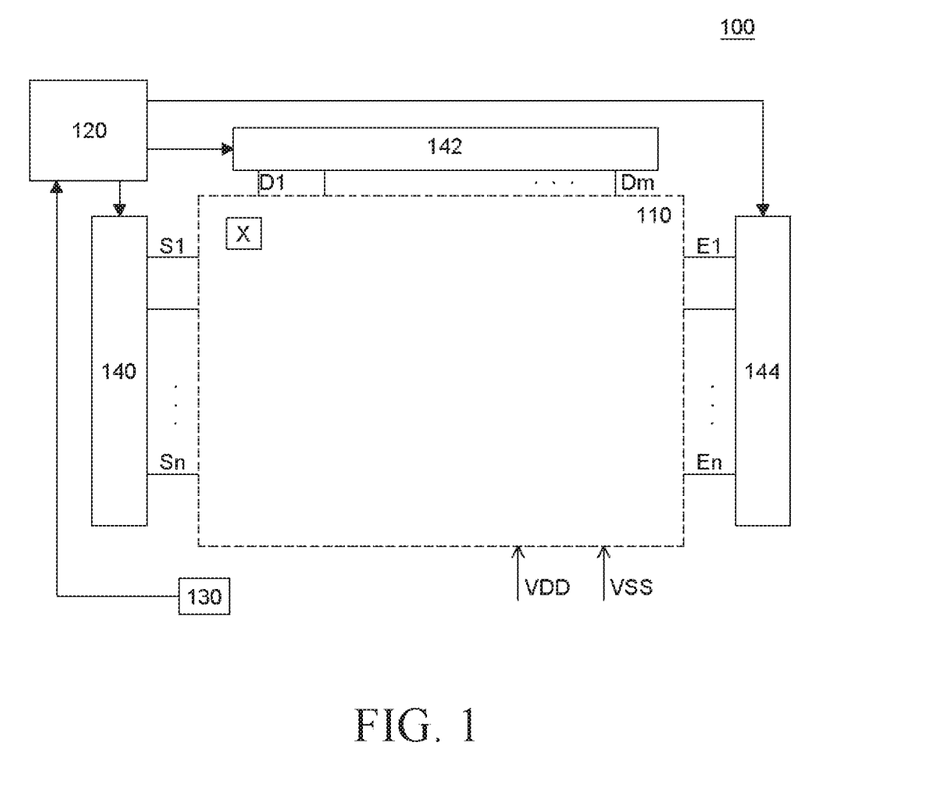
FIG. 1 is a schematic diagram of an organic light emitting display apparatus according to an exemplary embodiment of the present disclosure.

FIG. 1 is a schematic diagram of an organic light emitting display apparatus according to an exemplary embodiment of the present disclosure. Referring to FIG. 1, an organic light emitting display apparatus 100 according to an exemplary embodiment of the present disclosure is described. All the components of the organic light emitting display apparatus according to all embodiments of the present disclosure are operatively coupled and configured.

The organic light emitting display apparatus 100 according to an exemplary embodiment comprises an organic light emitting display panel 110, a controller 120, a thermal sensor 130 configured to sense temperature related to a plurality of sub-pixels, a gate driver 140, a first leakage current compensation unit (or data driver) 142, and a second leakage current compensation unit (or emission driver) 144.

The organic light emitting display panel 110 comprises a pixel area having a plurality of sub-pixels. A periphery area is configured adjacent to the pixel area. The pixel area is configured with a plurality of gate lines S1 to Sn, a plurality of the first compensation lines D1 to Dm, a plurality of the second compensation lines E1 to En and a plurality of sub-pixels for displaying an image. The gate line Sn may be extended along a first direction of the pixel area. The first compensation line Dm may be extended along a second direction of the pixel area, which intersects with the first direction. The second compensation line En may be extended along the first direction of the pixel area. But the present disclosure is not limited thereto.

The periphery area can be configured to surround some or all of the pixel area. At the periphery area, various circuits and lines are arranged to drive the sub-pixels of the pixel area. The organic light emitting display panel 110 is configured to be connected to a VDD voltage supply line VDD and a VSS voltage supply line VSS in order to supply voltage and current to an organic light emitting diode of the sub-pixel.

The controller 120 can be positioned at the periphery area. The controller 120 is configured to control the organic light emitting display panel 110 to display an image by receiving digital image signals and various control signals. For example, the controller 120 controls time intervals or frequencies of the image signals and the control signals for displaying the input digital image signals on the organic light emitting display panel 110. For example, the controller 120 may be a timing controller or a micro-processing unit MPU. But the present disclosure is not limited thereto and the controller 120 may be implemented with additional circuits, which are electrically connected to the organic light emitting display panel 110. For example, the controller 120 and the organic light emitting display panel 110 may be connected by a flexible cable, a flexible circuit board, a pin-connector and/or various components. The controller 120 may be configured to maintain a brightness of the plurality of sub-pixels under various temperature conditions. Further, the controller 120 may be configured to minimize an amount of leakage current passing through the leakage current path based on temperature dependent leakage current characteristics of a common layer shared by a plurality of sub-pixels.

The controller 120 is configured to determine or detect the temperature of the organic light emitting display panel 110 by receiving the thermal information from the thermal sensor 130, which may be implemented in a variety of ways, such as using sensors embedded between certain pixels, employing organic materials capable of emitting light as well as having characteristics that enable sensing of temperature, etc.

The controller 120 is configured to determine a first compensation signal value on the basis of the sensed thermal information. The controller 120 controls the first leakage current compensation unit 142 to output a predetermined first compensation signal value.

For example, the first leakage current compensation unit 142 is configured to output the voltage of the predetermined first compensation signal by the controller 120.

The controller 120 is configured to supply the second compensation signal to the second leakage current compensation unit 144 on the basis of the sensed thermal information.

For example, the controller 120 controls the first leakage current compensation unit 142 which supplies the first compensation signal to the plurality of sub-pixels and the second leakage current compensation unit 144 which supplies the second compensation signal. Moreover, the amount of leakage current of the plurality of sub-pixels can be compensated on the basis of the sensed temperature. The term "compensation" preferably means, for example, that even if the temperature is changed, the amount of leakage current is controlled to be maintained, thereby the image quality is maintained.

In some embodiments, the first leakage current compensation unit 142 and or the second leakage current compensation unit 144 may be integrated into the controller 120.

The thermal sensor 130 may be positioned at the periphery area. Various different types of thermal sensors may be applied to the thermal sensor 130. The controller 120 is configured to receive the thermal information of the organic light emitting display panel 110 from the thermal sensor 130.

But the present disclosure is not limited thereto, and the thermal sensor 130 may be embedded into the organic light emitting display panel 110. In such case, at least one sub-pixel may be configured to include a thermal sensor 130.

But the present disclosure is not limited thereto, and the thermal sensor 130 may be embedded into the controller 120. In such case, for example, the controller 120 may be mounted on a printed circuit board.

Depending on the location of the thermal sensor 130 of the organic light emitting display apparatus 100 according to an exemplary embodiment of the present disclosure, the thermal sensor 130 may be adjacent to the organic light emitting display panel 110 or vice versa. For example, an insulation layer or an insulation element may be interposed between the thermal sensor 130 and the organic light emitting display panel 110. Accordingly, a detection error may occur when the thermal sensor 130 senses the temperature of the organic light emitting display panel 110.

In such case, the controller 120 may further include an error correction data to compensate the difference between the sensed signal of the thermal sensor 130 and the actual temperature of the organic light emitting display panel 110. For example, the error correction data may be stored in a lookup table or in a memory. It is also possible to apply a compensation algorithm which analyzes the insulation characteristic between the thermal sensor 130 and the organic light emitting display panel 110.

A gate driver 140 is positioned at the periphery area. The gate driver 140 is configured to receive various control signals from the controller 120 and scan the gate lines from S1 to Sn, thereby the compensated data voltage can be stored at the pixel area of the organic light emitting display panel 110 supplied through the first compensation lines D1 to Dm. In other words, the compensated data voltage is charged at a storage capacitor of each pixel. The gate driver 140 is connected to the plurality of gate lines S1 to Sn. The gate driver 140 may be configured to be a gate-driver in panel which is integrated within the panel. The gate driver 140 may be configured to be a semiconductor chip, such as a chip on film (COF) type or a chip on glass (COG) type. But the present disclosure is not limited thereto.

The first leakage current compensation unit 142 is positioned at the periphery area. The first leakage current compensation unit 142 is configured to receive the image signal and the first compensation signal from the controller 120, and supply the compensated data voltage based on the leakage current characteristic according to the temperature of the pixel area of the organic light emitting display panel 110. The first leakage current compensation unit 142 receives gamma voltages from a gamma voltage generator and converts a digital image signal into a compensated analogue data voltage for generating the compensated data voltage. That is, the first leakage current compensation unit 142 generates the compensated data voltage by using the gamma voltage.

The gamma voltage generator generates the gamma voltage that is supplied to the first leakage current compensation unit 142. The gamma voltage is the reference voltage used for converting the digital image signals into the analogue image signals. The gamma voltage may be referred to as gamma reference voltages. For example, the gamma voltage may be configured to generate 256 gray level voltages to express an image signal with 8-bits gray levels (8-bit gradations) or the gamma voltage may be configured to express an image signal with 10-bits gray levels. But the present disclosure is not limited thereto and the number of gamma voltage may vary. Furthermore, in some cases, the gamma voltage generator may not or need not generate gamma voltages corresponding to all of the gray levels. For example, the gamma voltage generator only generates 16 gamma voltages and the first leakage current compensation unit 142 is configured to generate gray level voltages on the basis of the 16 gamma voltages, such as an interpolation technique may be implemented. The gamma voltage generator may be embedded into the controller 120 or embedded into the first leakage current compensation unit 142 or configured on an additional circuit board. But the present disclosure is not limited thereto.

The brightness of the sub-pixel may be adjusted according to the voltage level and the duty of the compensated data voltage supplied from the first leakage current compensation unit 142. The compensated data voltage of the organic light emitting display apparatus 100 according to an exemplary embodiment of the present disclosure is a compensated image signal with respect to the leakage current characteristic according to the temperature of the pixel area.

The second leakage current compensation unit 144 is positioned at the periphery area. The second leakage current compensation unit 144 receives the second compensation signal from the controller 120 and supplies an emission duty control signal (the second compensation signal) based on the leakage current characteristic according to the temperature of the pixel area of the organic light emitting display panel 110. The second leakage current compensation unit 144 may be configured to output a switching signal based on the duty of the second compensation signal determined by the controller 120. The emission duty control signal (the second compensation signal) of the organic light emitting display apparatus 100 according to an exemplary embodiment of the present disclosure is a control signal configured to adjust the emission duty of the sub-pixel with respect to the leakage current characteristic according to the temperature of the pixel area.

Accordingly, the second compensation signal is a different type of a signal from the first compensation signal. The first compensation signal is configured to adjust the voltage and the second compensation signal is configured to control the duty. By applying both the first compensation signals and the second compensation signals, the image quality can be compensated in the presence of the leakage current. But the present disclosure is not limited thereto.

Figure 2:
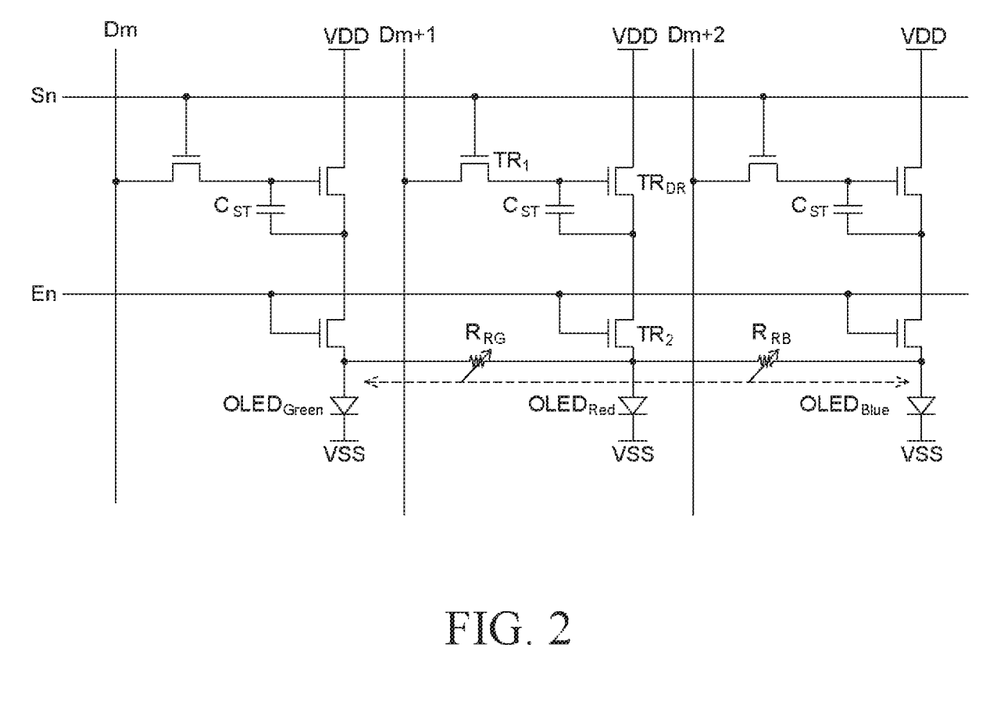
FIG. 2 is a circuit diagram illustrating an "X" area of FIG. 1.

FIG. 2 is an equivalent circuit diagram briefly illustrating sub-pixels of the pixel area of the organic light emitting display apparatus according to an exemplary embodiment of the present disclosure. Referring to FIG. 2, the organic light emitting display apparatus 100 according to an exemplary embodiment of the present disclosure is described.

A sub-pixel (area "X" in FIG. 1) of the pixel area of the organic light emitting display apparatus 100 according to an exemplary embodiments of the present disclosure comprises an organic light emitting diode OLED, a first compensation transistor $TR_1$, a second compensation transistor $TR_2$, a driving transistor $TR_{DR}$, and a storage capacitor $C_{ST}$.

The sub-pixel is configured to be connected to a gate line Sn, a first compensation line Dm, a second compensation line En, a VDD line VDD, and a VSS line VSS.

For the convenience of explanation, the red organic light emitting diode $OLED_{RED}$ as illustrated in FIG. 2 will be described as an example. The first compensation transistor $TR_1$ is illustrated as an N-type semiconductor, but the present disclosure is not limited thereto, and the first compensation transistor $TR_1$ can be a P-type semiconductor. The input electrode of the first compensation transistor $TR_1$ is connected to the first compensation line Dm+1 such that the compensated data voltage based on the leakage current characteristic according to the temperature (the first compensation signal) is input from the first leakage current compensation unit 142. The gate electrode of the first compensation transistor $TR_1$ is connected to the gate line Sn and is switched by the gate driving signal input from the gate driver 140. The output electrode of the first compensation transistor $TR_1$ is connected to the gate electrode of the driving transistor $TR_{DR}$ and an electrode of the storage capacitor $C_{ST}$ such that the compensated data voltage (the first compensation signal) is stored at the one electrode of the storage capacitor $C_{ST}$.

The driving transistor $TR_{DR}$ is illustrated as an N-type semiconductor, but the present disclosure is not limited thereto, and the driving transistor $TR_{DR}$ can be a P-type semiconductor. The input electrode of the driving transistor $TR_{DR}$ is connected to the VDD line (VDD) for receiving the VDD voltage. The driving transistor $TR_{DR}$ controls the amount of the current supplied to the organic light emitting diode OLED on the basis of the potential difference between the one electrode of the storage capacitor $C_{ST}$ connected to the gate electrode of the driving transistor $TR_{DR}$ and the other electrode of the storage capacitor $C_{ST}$ connected to the output electrode of the driving transistor $TR_{DR}$.

The second compensation transistor $TR_2$ is illustrated as an N-type semiconductor, but the present disclosure is not limited thereto, and the second compensation transistor $TR_2$ can be a P-type semiconductor. The input electrode of the second compensation transistor $TR_2$ is connected to the output electrode of the driving transistor $TR_{DR}$ and receives the current supplied to the red organic light emitting diode $OLED_{RED}$. The gate electrode of the second compensation transistor $TR_2$ is connected to the second compensation line En, which is switched according to the switching signal outputted from the second leakage current compensation unit 144, that is, according to the emission duty control signal (the second compensation signal) based on leakage current according to the temperature, where the emission duty control signal is input from the second leakage current compensation unit 144.

The anode of the organic light emitting diode OLED is connected to the output electrode of the second compensation transistor $TR_2$. The cathode of the organic light emitting diode OLED is connected to the VSS line. The emission duty of the organic light emitting diode OLED is controlled by the emission duty control signal (the second compensation signal), which is applied to the second compensation transistor $TR_2$.

Referring to FIG. 2, if a specific amount of current flows through the red organic light emitting diode $OLED_{RED}$, a leakage current flows through the common layer. Thus, a specific amount of leakage current is supplied to the adjacent green organic light emitting diode $OLED_{GREEN}$ and the adjacent blue organic light emitting diode $OLED_{BLUE}$. By the leakage current, each of the organic light emitting diodes $OLED_{GREEN}$ and $OLED_{BLUE}$ may be emitted, therefore, the image quality may be deteriorated.

The leakage current path from the red organic light emitting diode $OLED_{RED}$ to the green organic light emitting diode $OLED_{GREEN}$ can be expressed as a first variable resistance $R_{RG}$. In this case, the leakage current path may be at least one common layer.

The leakage current path from the red organic light emitting diode $OLED_{RED}$ to the blue organic light emitting diode $OLED_{BLUE}$ can be expressed as a second variable resistance $R_{RB}$. In this case, the leakage current path may be at least one common layer.

Figure 3:
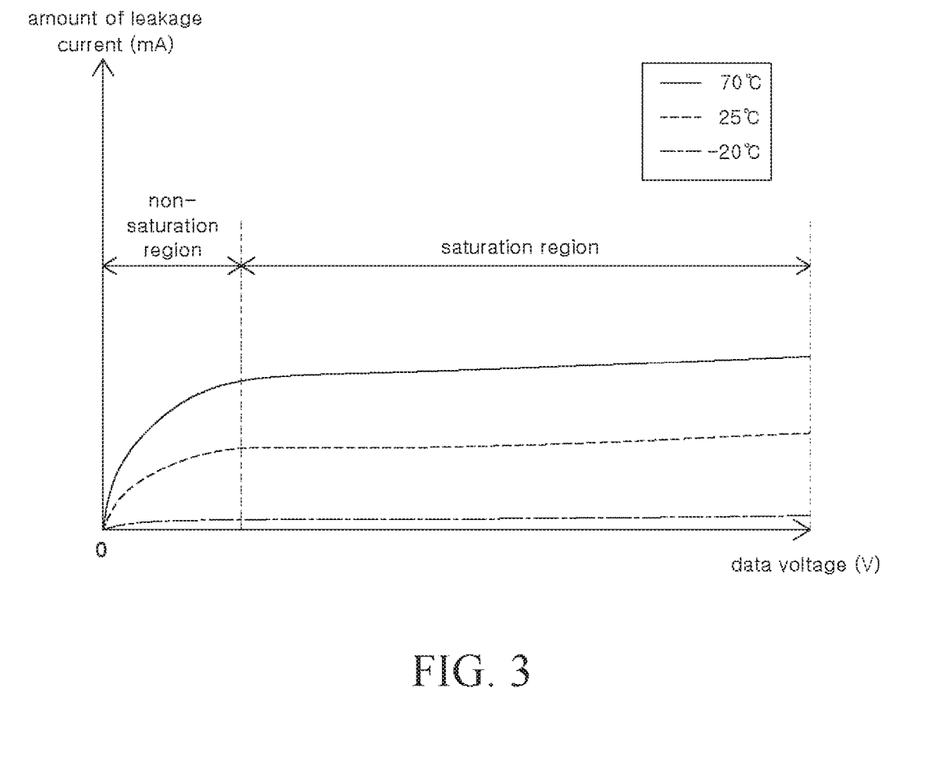
FIG. 3 is a graph illustrating the amount of leakage current characteristic according to the data voltage and the temperature of the organic light emitting display apparatus according to an exemplary embodiment of the present disclosure.

FIG. 3 is a graph illustrating the compensated data voltage (the first compensation signal) and the leakage current characteristic according to the temperature of the organic light emitting display apparatus 100 according to an exemplary embodiment of the present disclosure.

Referring to FIG. 3, the amount of leakage current passing through the first variable resistance $R_{RG}$ has a characteristic that increases with increasing data voltage (the first compensation signal), then is saturated from a specific data voltage. That is, the saturation region of the data voltage may be the high gray level (gradation) region of the image signal. For example, the saturation region may start from the 30th gray level. But the present disclosure is not limited thereto.

Moreover, the amount of leakage current has a characteristic that increases with increasing temperature. For example, when the temperature is −20° C., the amount of leakage current is less than that at the room temperature of 25° C. Also, when the temperature is 70° C., the amount of leakage current is more than that at the room temperature of 25° C.

For example, when a red organic light emitting diode $OLED_{RED}$ is intended to display a specific image signal corresponding to a specific gray level, the controller 120 generates a first compensation signal and a second compensation signal, so that leakage current flows to the adjacent green organic light emitting diode $OLED_{GREEN}$ and blue organic light emitting diode $OLED_{BLUE}$ regardless of the variable amount of leakage current according to temperature.

For example, the controller 120 is configured to determine the voltage level of the first compensation signal on the basis of the leakage current characteristic based on the sensed temperature. If the sensed temperature is increased, the controller 120 is configured to increase the voltage level of the first compensation signal. Moreover, the controller 120 is configured to determine the duty of the second compensation signal on the basis of the leakage current characteristic according to the sensed temperature. If the sensed temperature is increased, the controller 120 is configured to decrease the duty of the second compensation signal. As illustrated in FIG. 3, the amount of leakage current will not be increased from at some point even if the voltage level of the first compensation signal is increased, which means that the amount of leakage current will be saturated. Thus, it is advantageous that the amount of leakage current can be reduced and the brightness of the sub-pixel can be maintained by increasing the voltage level of the first compensation signal and decreasing the duty of the second compensation signal simultaneously.

That is, the first compensation signal and the second compensation signal can be set according to the leakage current saturation point according to temperature changes.

That is, the controller 120 controls the voltage level of the first compensation signal and the duty ratio of the second compensation signal to be inversely proportional to each other. Moreover, the saturation point values can be stored in a memory or a lookup table with respect to the leakage characteristics of corresponding common layers that provide the leakage current paths.

As an example, if the voltage level of the first compensation signal is reduced and the duty ratio of the second compensation signal is reduced, the brightness of the sub-pixel is reduced. Therefore, even if the amount of leakage current is reduced, the image quality can be distorted.

As an example, if the voltage level of the first compensation signal is increased and the duty ratio of the second compensation signal is increased, the brightness of the sub-pixel is increased. Therefore, the amount of leakage current is not decreased and the leakage current cannot be compensated.

Figure 4A:
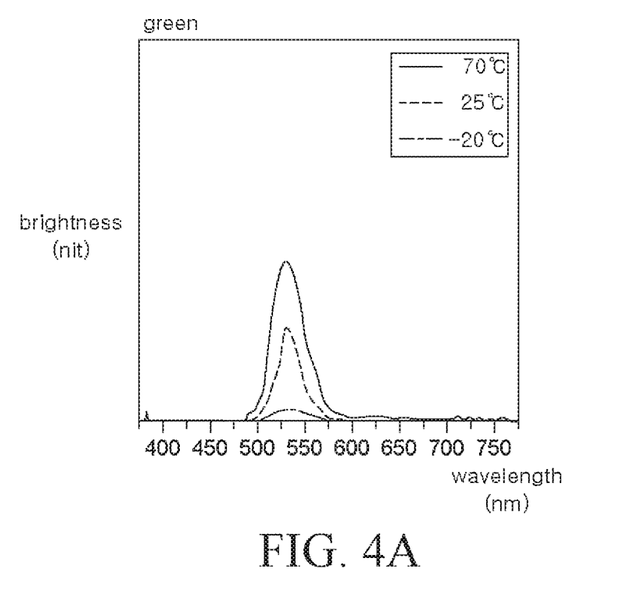
FIG. 4A to 4C are graphs illustrating deteriorated image quality according to the amount of leakage current with temperature between adjacent sub-pixels of the related art.
Figure 4B:
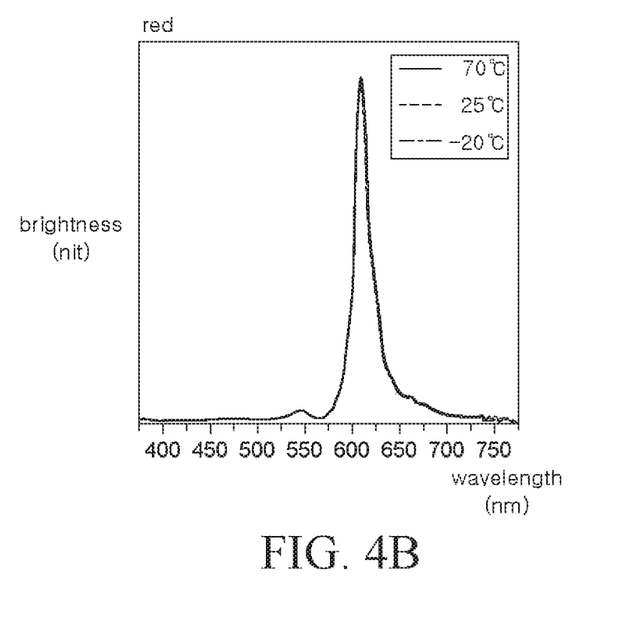
Figure 4C:
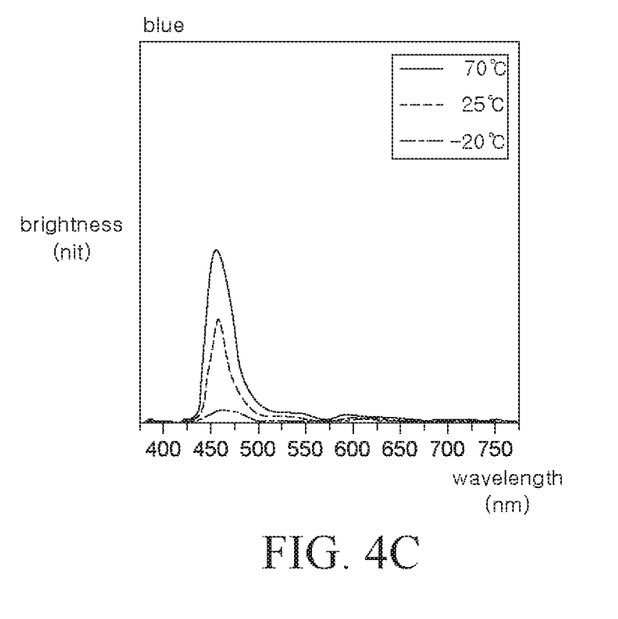

FIG. 4A to FIG. 4C are graphs according to a comparative example for explaining a green organic light emitting diode $OLED_{GREEN}$ and a blue organic light emitting diode $OLED_{BLUE}$ which undesirably emit light due to the leakage current supplied from an adjacent red organic light emitting diode $OLED_{RED}$, when the red organic light emitting diode $OLED_{RED}$ is emitting. FIG. 4A corresponds to the green organic light emitting diode $OLED_{GREEN}$. FIG. 4B corresponds to the red organic light emitting diode $OLED_{RED}$. FIG. 4C corresponds to the blue organic light emitting diode $OLED_{BLUE}$. The red organic light emitting diode $OLED_{RED}$ emits light, since an image signal is supplied. The green organic light emitting diode $OLED_{GREEN}$ and the blue organic light emitting diode $OLED_{BLUE}$ emit light due to the leakage current supplied from the red organic light emitting diode $OLED_{RED}$ through the common layer.

Referring to FIG. 4B, the dot-dash line represents the visible wavelengths spectrum of the red organic light emitting diode $OLED_{RED}$ with a data voltage of 3V, which corresponds to the $100^{th}$ gray level at temperature of minus 20° C. However, the present disclosure is not limited to any gray levels and/or any data voltages, and each of the values used in the present disclosure is only one example for convenience of description.

The dot line represents the visible wavelengths spectrum of the red organic light emitting diode $OLED_{RED}$ with a data voltage of 3V, which corresponds to the $100^{th}$ gray level at temperature of 25° C.

The solid line represents the visible wavelengths spectrum of the red organic light emitting diode $OLED_{RED}$ with a data voltage of 3V, which corresponds to the $100^{th}$ gray level at temperature of 70° C.

As there is no leakage current contribution from the green or blue OLED, the wavelengths of the red OLED for the different temperatures are very similar.

In case of FIG. 4B, the green organic light emitting diode $OLED_{GREEN}$ and the blue organic light emitting diode $OLED_{BLUE}$ are switched off. Consequently, no such leakage current is supplied from the green organic light emitting diode $OLED_{GREEN}$ and the blue organic light emitting diode $OLED_{BLUE}$ to the red organic light emitting diode $OLED_{RED}$. Thus, the visible wavelength spectrum of the red organic light emitting diode $OLED_{RED}$ is not changed according to temperature variation, and the dot-dash line, dot line and solid line in FIG. 4B are coincident. It should be noted that the red organic light emitting diode $OLED_{RED}$ is selected as an emitting element merely for convenience of description.

Referring to FIG. 4A, the dot-dash line represents the visible wavelengths spectrum of the green organic light emitting diode $OLED_{GREEN}$ adjacent to the red organic light emitting diode $OLED_{RED}$ when the red organic light emitting diode OLED$_{RED}$ operates with a data voltage of 3V, which corresponds to the 100$^{th}$ gray level at temperature of minus 20° C.

The dot line represents the visible wavelengths spectrum of the green organic light emitting diode OLED$_{GREEN}$ adjacent to the red organic light emitting diode OLED$_{RED}$ when the red organic light emitting diode OLED$_{RED}$ operates with a data voltage of 3V, which corresponds to the 100th gray level at temperature of 25° C. The amount of leakage current is increased as the temperature is increased when compared to the dot-dash line. Accordingly, the green organic light emitting diode OLED$_{GREEN}$ emits light corresponding to the leakage current supplied from the adjacent red organic light emitting diode OLED$_{RED}$.

The solid line represents the visible wavelengths spectrum of the green organic light emitting diode OLED$_{GREEN}$ adjacent to the red organic light emitting diode OLED$_{RED}$ when the red organic light emitting diode OLED$_{RED}$ operates with a data voltage of 3V, which corresponds to the 100th gray level at temperature of 70° C. The amount of leakage current is increased as the temperature is increased when compared to the dot line. Accordingly, the green organic light emitting diode OLED$_{GREEN}$ emits light corresponding to the leakage current supplied from the adjacent red organic light emitting diode OLED$_{RED}$. It should be noted that the green organic light emitting diode OLED$_{GREEN}$ is selected as an affected element by the leakage current merely for convenience of description.

Referring to FIG. 4C, the dot-dash line represents the visible wavelengths spectrum of the blue organic light emitting diode OLED$_{BLUE}$ adjacent to the red organic light emitting diode OLED$_{RED}$ when the red organic light emitting diode OLED$_{RED}$ operates with a data voltage of 3V, which corresponds to the 100$^{th}$ gray level at temperature of minus 20° C.

The dot line represents the visible wavelengths spectrum of the blue organic light emitting diode OLED$_{BLUE}$ adjacent to the red organic light emitting diode OLED$_{RED}$ when the red organic light emitting diode OLED$_{RED}$ operates with a data voltage of 3V, which corresponds to the 100th gray level at temperature of 25° C. The amount of leakage current is increased as the temperature is increased compare to the dot-dash line. Accordingly, the blue organic light emitting diode OLED$_{BLUE}$ emits light corresponding to the leakage current supplied from the adjacent red organic light emitting diode OLED$_{RED}$.

The solid line represents the visible wavelengths spectrum of the blue organic light emitting diode OLED$_{BLUE}$ adjacent to the red organic light emitting diode OLED$_{RED}$ when the red organic light emitting diode OLED$_{RED}$ operates with a data voltage of 3V, which corresponds to the 100th gray level at temperature of 70° C. The amount of leakage current is increased as the temperature is increased compare to the dot line. Accordingly, the blue organic light emitting diode OLED$_{BLUE}$ emits light corresponding to the leakage current supplied from the adjacent red organic light emitting diode OLED$_{RED}$. It should be noted that the blue organic light emitting diode OLED$_{BLUE}$ is selected as an affected element by the leakage current merely for convenience of description.

Figure 5A:
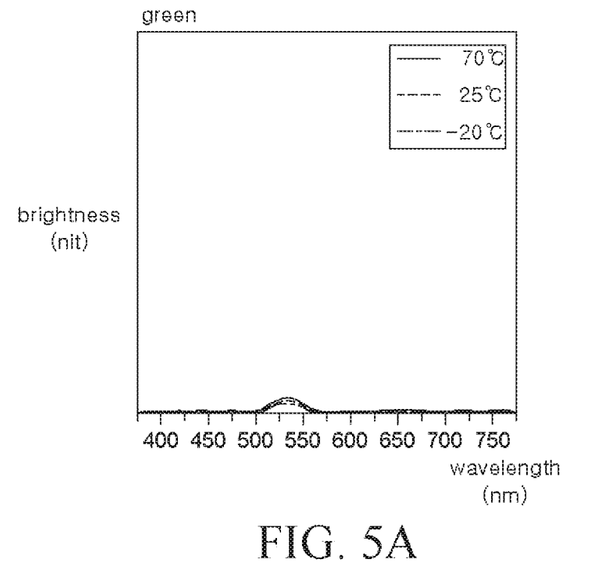
FIG. 5A to 5C are graphs illustrating compensated image quality according to the amount of leakage current with temperature between adjacent sub-pixels of the organic light emitting display apparatus according to an exemplary embodiment of the present disclosure.
Figure 5B:
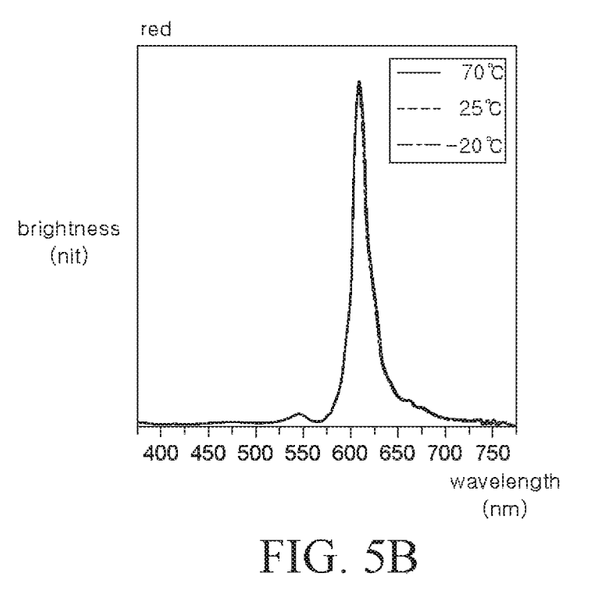
Figure 5C:
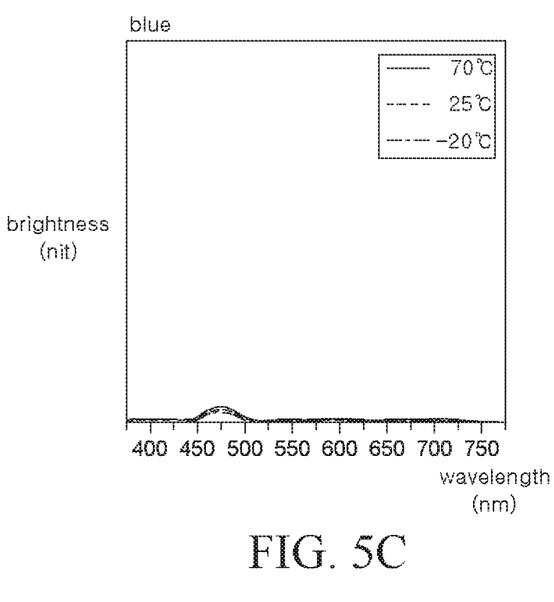

FIG. 5A to FIG. 5C are graphs according to an exemplary embodiment of the present disclosure explaining the leakage currents supplied to the adjacent green organic light emitting diode OLED$_{GREEN}$ and the adjacent blue organic light emitting diode OLED$_{BLUE}$ from the red organic light emitting diode OLED$_{RED}$, when the red organic light emitting diode OLED$_{RED}$ is emitting, which are compensated according to temperature.

To be specific, the organic light emitting display apparatus 100 according to an exemplary embodiment of the present disclosure may compensate a variation of leakage current from one of illuminating organic light emitting diode OLED to the adjacent organic light emitting diodes OLEDs, on the basis of temperature variation and the brightness of the illuminating organic light emitting diode OLED, the leakage current is substantially maintained regardless of temperature variation thereby providing a proper image quality regardless of temperature variation.

Referring to FIG. 5B, the dot-dash line represents the visible wavelengths spectrum of the red organic light emitting diode OLED$_{RED}$ of the organic light emitting display apparatus 100 according to an embodiment of the present disclosure when displaying the 100$^{th}$ gray level at temperature of minus 20° C. with leakage current variation compensation. For example, to display 100$^{th}$ gray level with leakage current variation compensation at temperature of minus 20° C., a compensated data voltage of 3V and an emission duty control signal (the second compensation signal) of 100% emission duty are supplied to the red organic light emitting diode OLED$_{RED}$. According to such configuration, the red organic light emitting diode OLED$_{RED}$ may have substantially the same wavelength as FIG. 4B.

The dot line represents the visible wavelengths spectrum of the red organic light emitting diode OLED$_{RED}$ of the organic light emitting display apparatus 100 according to an embodiment of the present disclosure when displaying the 100$^{th}$ gray level at temperature of 25° C. with leakage current variation compensation. For example, to display 100$^{th}$ gray level with leakage current variation compensation at temperature of 25° C., a compensated data voltage of 4.5V and an emission duty control signal (the second compensation signal) of 50% emission duty are supplied to the red organic light emitting diode OLED$_{RED}$. According to such configuration, the red organic light emitting diode OLED$_{RED}$ may have substantially the same wavelength as FIG. 4B.

The solid line represents the visible wavelengths spectrum of the red organic light emitting diode OLED$_{RED}$ of the organic light emitting display apparatus 100 according to an embodiment of the present disclosure when displaying the 100$^{th}$ gray level at temperature of 70° C. with leakage current variation compensation. For example, to display 100$^{th}$ gray level with leakage current variation compensation at temperature of 70° C., a compensated data voltage of 6.5V and an emission duty control signal (the second compensation signal) of 20% emission duty are supplied to the red organic light emitting diode OLED$_{RED}$. According to such configuration, the red organic light emitting diode OLED$_{RED}$ may have substantially the same wavelength as FIG. 4B.

Referring to FIG. 5A and FIG. 5C, the dot-dash lines represent the visible wavelengths spectrum of the green organic light emitting diode OLED$_{GREEN}$ and the blue organic light emitting diode OLED$_{BLUE}$ of the organic light emitting display apparatus 100 according to an embodiment of the present disclosure when the adjacent red organic light emitting diode OLED$_{RED}$ displays the 100$^{th}$ gray level at temperature of minus 20° C. with leakage current variation compensation.

As described above, the compensated data voltage of 3V and the emission duty control signal (the second compensation signal) of 100% emission duty are supplied to the red organic light emitting diode $OLED_{RED}$.

Referring to FIG. 3 again, the amount of leakage current at lower temperature (minus 20° C.) is relatively less than that at higher temperature. Accordingly, it can be seen that even if applying an ordinary 3V data voltage with 100% emission duty, the amount of leakage currents at the adjacent green organic light emitting diode $OLED_{GREEN}$ and the adjacent blue organic light emitting diode $OLED_{BLUE}$ are minimized.

Referring to FIG. 5A and FIG. 5C, the dot lines represent the visible wavelengths spectrums of the blue organic light emitting diode $OLED_{BLUE}$ and green organic light emitting diode $OLED_{GREEN}$ adjacent to the red organic light emitting diode $OLED_{RED}$ of the organic light emitting display apparatus 100 according to an embodiment of the present disclosure when the red organic light emitting diode $OLED_{RED}$ displays the $100^{th}$ gray level at temperature of 25° C. with leakage current variation compensation.

The solid lines represent the visible wavelengths spectrums of the blue organic light emitting diode $OLED_{BLUE}$ and green organic light emitting diode $OLED_{GREEN}$ adjacent to the red organic light emitting diode $OLED_{RED}$ of the organic light emitting display apparatus 100 according to an embodiment of the present disclosure when the red organic light emitting diode $OLED_{RED}$ displays the $100^{th}$ gray level at temperature of 70° C. with leakage current variation compensation.

As described above, a compensated data voltage of 4.5V and an emission duty control signal (the second compensation signal) of 50% emission duty are supplied to the red organic light emitting diode $OLED_{RED}$.

Referring to FIG. 3 again, the amount of leakage current at room temperature (25° C.) is relatively more than that at low temperature. Consequently, the amount of leakage current of the adjacent blue organic light emitting diode $OLED_{BLUE}$ and the adjacent green organic light emitting diode $OLED_{GREEN}$ can be increased. However, if the emission duty is decreased to 50%, the amount of leakage current may be decreased to 50% for an image frame (e.g., duration of an image frame of 60 Hz is 16.7 ms). As the emission period is reduced to 50%, the brightness of the red organic light emitting diode $OLED_{RED}$ is decreased in correspondence to the emission duty.

In order to solve the above-described dimmed brightness problem, the compensated data voltage is applied. If the peak brightness of the red organic light emitting diode $OLED_{RED}$ is increased according to the dimmed emission duty can substantially achieve the same brightness. For example, the compensated data voltage can be 4.5V.

Especially, the leakage current tends to saturate when the data voltage is increased such that the amount of the leakage current is not increased any more, regardless of the increase in the data voltage in the saturation region. According to the above-described configuration, even if the temperature is increased, the amount of leakage current may not be increased. Thus, the image quality can be maintained.

Therefore, when a compensated data voltage of 4.5V with 50% emission duty is applied, the brightness of the red organic light emitting diode $OLED_{RED}$ can be maintained and the amount of leakage current of the adjacent blue organic light emitting diode $OLED_{BLUE}$ and the adjacent green organic light emitting diode $OLED_{GREEN}$ can be decreased.

Referring to FIG. 5A, the solid lines represent the visible wavelengths spectrums of the green organic light emitting diode $OLED_{GREEN}$ adjacent to the red organic light emitting diode $OLED_{RED}$ of the organic light emitting display apparatus 100 according to an embodiment of the present disclosure when the red organic light emitting diode $OLED_{RED}$ displays the $100^{th}$ gray level at temperature of 70° C. with leakage current variation compensation. The dot line and the dot-dash line use the same principle as in the case of the solid line, therefore redundant descriptions regarding the remaining lines of FIG. 5A and FIG. 5C will be omitted (or will be brief) merely for the sake of the brevity. However, the emission duty can be further reduced and the data voltage can be increased for further reducing the amount of leakage current.

As described above, a compensated data voltage of 6.5V with 20% emission duty is supplied to the red organic light emitting diode $OLED_{RED}$. And to solve the dimmed brightness problem as described above, the compensated data voltage is applied. That is, the peak brightness of the red organic light emitting diode $OLED_{RED}$ can be increased to remedy the dimmed brightness problem as described above. For example, the compensated data voltage may be 6.5V.

Figure 6A:
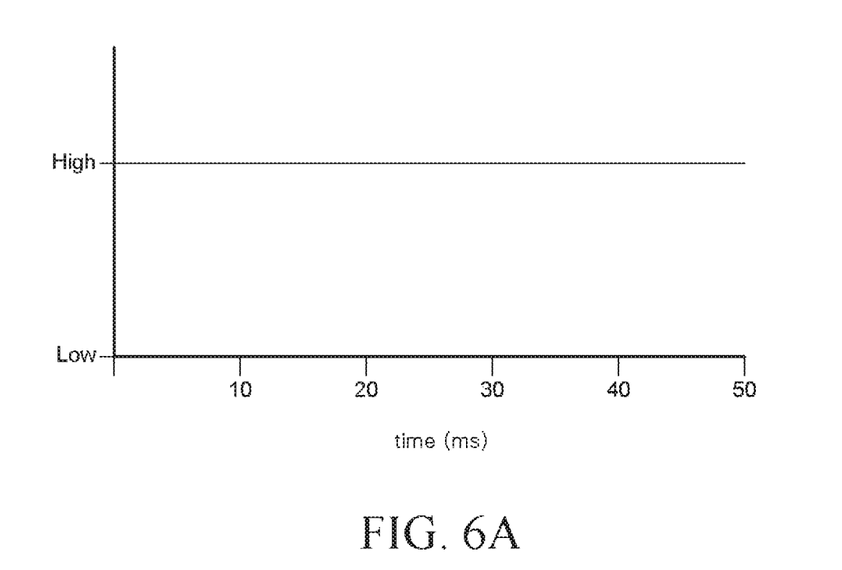
FIG. 6A to 6C are graphs illustrating the compensation signal of the organic light emitting display apparatus according to an exemplary embodiment of the present disclosure.
Figure 6B:
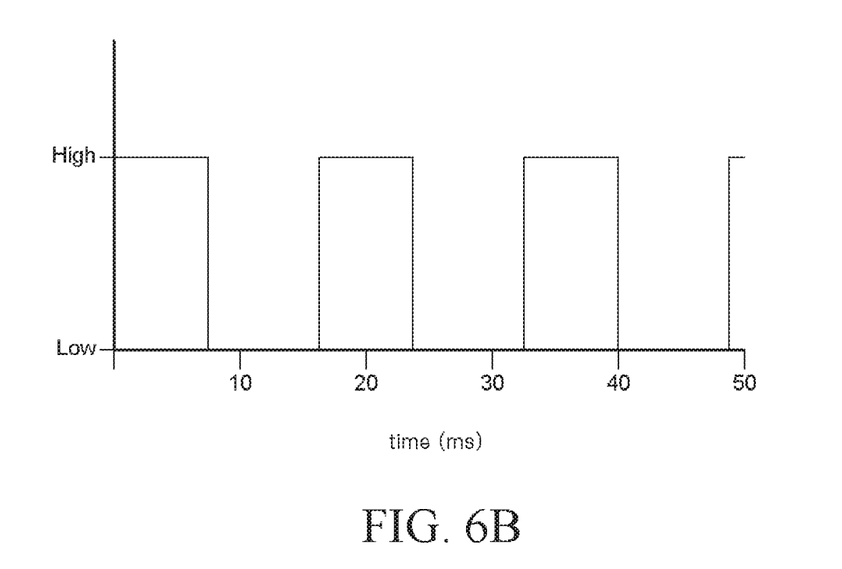
Figure 6C:
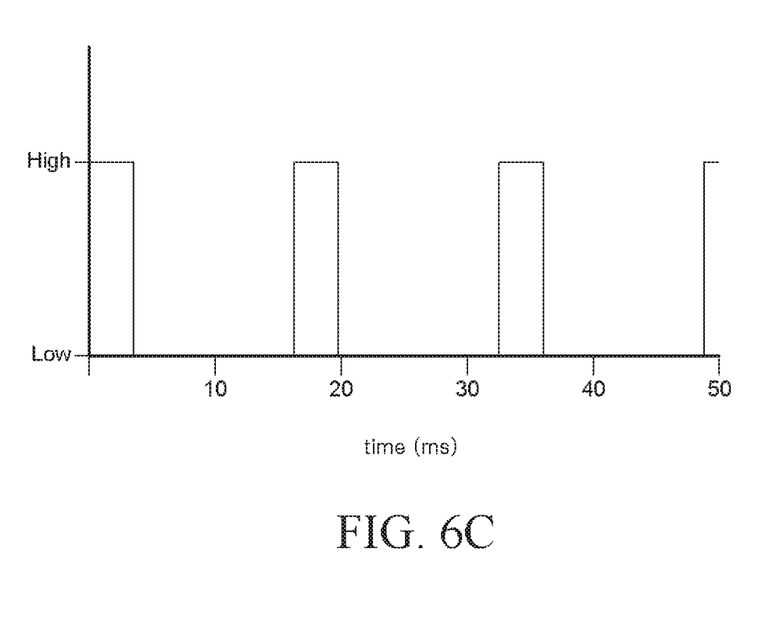

FIG. 6A represents the waveform of the second compensation signal when displaying the $100^{th}$ gray level at minus 20° C.). FIG. 6B represents the waveform of the second compensation signal when displaying the $100^{th}$ gray level at 25° C.). FIG. 6C represents the waveform of the second compensation signal when displaying the $100^{th}$ gray level at 70° C.). In FIGS. 6A-6C, the abscissa axis represents time (ms), the vertical axis represents voltage level. That is, as the emission duty is decreased, the amount of leakage current is reduced.

The controller 120 is configured to control the first leakage current compensation unit 142 and the second leakage current compensation unit 144, reducing the deviation of the leakage current due to temperature change, on the basis of the sensed thermal information to suppress image quality deterioration.

The first leakage current compensation unit 142 receives the first compensation signal from the controller 120 for generating a predetermined compensation data voltage. The first compensation signal is configured to determine the level of the data voltage on the basis of the sensed thermal information. The first compensation signal can be stored in the controller 120 by analyzing the characteristics of the leakage current according to the temperature of the organic light emitting display apparatus 100 during a manufacturing process.

The second leakage current compensation unit 144 is configured to receive the second compensation signal from the controller 120 to operate with a predetermined emission duty. The emission duty of the second compensation signal is determined on the basis of the sensed thermal information. The second compensation signal can be stored in the controller 120 by analyzing the characteristics of the leakage current according to the temperature of the organic light emitting display apparatus 100 during a manufacturing process. The first compensation signal and the second compensation signal are in correlation to each other. Thus, the controller 120 can be configured to control both the first compensation signal and the second compensation signal.

The exemplary embodiments of the present disclosure can also be described as follows.

According to an aspect of the present disclosure, an organic light emitting display apparatus comprises a thermal sensor configured to sense temperature and a controller comprising a first leakage current compensation unit configured to supply a first compensation signal to a plurality of sub-pixels based on the sensed temperature from the thermal sensor and a second leakage current compensation unit configured to supply a second compensation signal which is different from the first compensation signal, wherein the controller is configured to compensate an amount of leakage current of the plurality of sub-pixels according to the sensed temperature.

The controller may be configured to determine a voltage level of the first compensation signal based on a leakage current characteristic according to the sensed temperature.

The first leakage current compensation unit may be configured to output the voltage of the first compensation signal determined by the controller.

If the sensed temperature is increased, the controller may be configured to increase the voltage level of the first compensation signal.

The controller may be configured to determine a duty of the second compensation signal based on a leakage current characteristic according to the sensed temperature.

The second leakage current compensation unit may be configured to output a switching signal based on the duty of the second compensation signal determined by the controller.

If the sensed temperature is increased, the controller may be configured to decrease the duty of the second compensation signal.

The controller may be configured to control the voltage level of the first compensation signal and the duty of the second compensation signal in inverse proportion to each other.

The plurality of sub-pixels may further comprise an organic light emitting diode, a driving transistor, a compensation transistor, a second compensation transistor and a storage capacitor, the first compensation signal may be input to the first compensation transistor, and the second compensation signal may be input to the second compensation transistor.

The second compensation transistor may be located between the first compensation transistor and the organic light emitting diode to control an emission duty of the organic light emitting diode.

The first compensation signal and the second compensation signal may be set in consideration of leakage current saturation point according to the temperature.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purpose only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. An organic light emitting display apparatus comprising:
   a thermal sensor to sense a temperature related to a plurality of sub-pixels; and
   a controller to compensate an amount of leakage current of the plurality of sub-pixels according to the sensed temperature, the controller including:
   a first leakage current compensator to receive a first compensation signal from the controller and supply a compensated voltage to the plurality of sub-pixels based on the sensed temperature from the thermal sensor, and
   a second leakage current compensator to receive a second compensation signal from the controller and supply a duty signal to the plurality of sub-pixels, the second compensation signal being different from the first compensation signal,
   wherein the controller further controls a voltage level of the first compensation signal and a duty of the second compensation signal in inverse proportion to each other.

2. The organic light emitting display apparatus of claim 1, wherein the controller determines the voltage level of the first compensation signal based on a leakage current characteristic according to the sensed temperature.

3. The organic light emitting display apparatus of claim 2, wherein the first leakage current compensator outputs the voltage level of the first compensation signal determined by the controller.

4. The organic light emitting display apparatus of claim 2, wherein when the sensed temperature is increased, the controller increases the voltage level of the first compensation signal.

5. The organic light emitting display apparatus of claim 2, wherein the controller determines the duty of the second compensation signal based on the leakage current characteristic according to the sensed temperature.

6. The organic light emitting display apparatus of claim 5, wherein the second leakage current compensator outputs a switching signal based on the duty of the second compensation signal determined by the controller.

7. The organic light emitting display apparatus of claim 5, wherein when the sensed temperature is increased, the controller is configured to decrease the duty of the second compensation signal.

8. The organic light emitting display apparatus of claim 1, wherein the first compensation signal and the second compensation signal are set in consideration of leakage current saturation point according to the temperature.

9. The organic light emitting display apparatus of claim 1, wherein the temperature and the compensated voltage are directly proportional.

10. An organic light emitting display apparatus comprising:
    a plurality of sub-pixels sharing a common layer between an anode and a cathode, the common layer providing a leakage current path between adjacent sub-pixels of the plurality of sub-pixels;
    a sensor to sense a temperature related to the plurality of sub-pixels;
    a data driver to supply a compensated voltage to the plurality of sub-pixels;
    an emission driver to supply a duty signal to the plurality of sub-pixels; and
    a controller to control the data driver and the emission driver based on the sensed temperature using a first compensation signal and a second compensation signal, respectively,
    wherein the controller controls a voltage level of the first compensation signal and a duty of the second compensation signal in inverse proportion to each other.

11. The organic light emitting display apparatus of claim 10, wherein the controller controls the voltage level of the first compensation signal and the duty of the second compensation signal based on the sensed temperatures.

12. The organic light emitting display apparatus of claim 11, wherein the controller maintains a brightness of the plurality of sub-pixels under various temperature conditions.

13. The organic light emitting display apparatus of claim 12, wherein the controller minimizes an amount of leakage current passing through the leakage current path based on temperature dependent leakage current characteristics of the common layer.

14. The organic light emitting display apparatus of claim 10, wherein the temperature and the compensated voltage are directly proportional.

* * * * *